United States Patent
Matsuda et al.

(10) Patent No.: US 9,503,083 B2
(45) Date of Patent: Nov. 22, 2016

(54) FORCE FEEDBACK-TYPE TOUCH PANEL DEVICE

(71) Applicant: SMK Corporation, Tokyo (JP)

(72) Inventors: Takeshi Matsuda, Kanagawa (JP); Masaji Komuro, Kanagawa (JP)

(73) Assignee: SMK Corporation, Tokyo (JP)

( * ) Notice: Subject to any disclaimer, the term of this patent is extended or adjusted under 35 U.S.C. 154(b) by 270 days.

(21) Appl. No.: 14/155,373

(22) Filed: Jan. 15, 2014

(65) Prior Publication Data

US 2014/0202843 A1    Jul. 24, 2014

(30) Foreign Application Priority Data

Jan. 18, 2013   (JP) ................................. 2013-020864

(51) Int. Cl.
*H03K 17/975*   (2006.01)
*H03K 17/96*    (2006.01)

(52) U.S. Cl.
CPC ... *H03K 17/962* (2013.01); *H03K 2217/96062* (2013.01); *H03K 2217/960755* (2013.01)

(58) Field of Classification Search
CPC .... H03K 17/96; H03K 17/962; G06F 3/033; G06F 3/041; G06F 3/044; H01H 13/00; H01H 13/10; H01H 13/50; H01H 2003/506; H01H 2215/008; H01H 2215/038; H01H 2215/042; H01H 2215/05; H01H 3/00; H01H 3/12; H01H 36/004; H01H 36/002; H01H 36/0026; H01H 36/0006; H01H 36/00; H01H 2003/008; H01H 2003/12; H01H 2085/004; H01H 2215/00; H01H 2215/028; H01H 2221/00; H01H 2221/036; H01H 2221/04; H01H 2221/048; H01H 2221/06; H01H 2221/062; H01H 2239/074; G09G 5/00

USPC ....... 200/181, 600; 345/173–184; 178/18.01, 178/18.03
See application file for complete search history.

(56) References Cited

U.S. PATENT DOCUMENTS

| 6,985,058 B2 * | 1/2006 | D'Amico | H01H 1/0036 200/181 |
| 2004/0178996 A1 * | 9/2004 | Kurashima | G06F 1/1626 345/173 |
| 2013/0154984 A1 | 6/2013 | Gondo | |

FOREIGN PATENT DOCUMENTS

| JP | H9-115379 A | 5/1997 |
| JP | 2006-079136 A | 3/2006 |

OTHER PUBLICATIONS

Office Action issued for counterpart Japanese Application 2013-020864, issued by the Japan Patent Office on Oct. 28, 2014.

*Primary Examiner* — Renee Luebke
*Assistant Examiner* — Anthony R. Jimenez

(57) ABSTRACT

A force feedback-type touch panel device is provided which can provide an operator with clearer feedback than that of conventional art by presenting the operator with vibration having a larger vibration amplitude than that of conventional art and can prevent any breakage or damage of a touch panel when an external impact is applied to the touch panel. The touch panel device includes a base member, a touch panel retained by the base member, a cover member formed in a shape covering the touch panel with a hard synthetic resin, and an actuator that causes the cover member to be displaced along the perpendicular direction with respect to a flat surface of the touch panel. The cover member is urged in the direction toward the base member using an attraction force generated between a first magnet fixed on the base member and a second magnet fixed on the cover member.

4 Claims, 8 Drawing Sheets

FORCE FEEDBACK-TYPE TOUCH PANEL DEVICE

CROSS REFERENCE TO RELATED APPLICATION

The contents of the following Japanese patent application are incorporated herein by reference,
NO. 2013-020864 filed on Jan. 18, 2013.

FIELD

The present invention relates to a touch panel device provided with a force feedback function that presents a tactile sensation to an operator by vibrating an operation surface.

BACKGROUND

With respect to an operation input device using a touch panel, a so-called force feedback-type touch panel has been known which is provided with a function that presents a tactile sensation to an operator by vibrating the touch panel to let the operator know that his/her operation has been accepted by the device.

For example, in Patent Literature 1, a tactile presentation device is disclosed in which a panel for presenting a tactile sensation is vibrated at a specific frequency in a perpendicular direction with respect to a flat surface using a magnetic force (See FIG. 7 of the present application). More specifically, a panel 80 is vibrated using a magnetic force that is generated between a coil 81, which is provided on a peripheral edge portion of a back surface of the panel 80, and a magnetic unit 82 that includes a magnet 89 and a yoke 88, both of which are arranged to face the coil 81, and the tactile presentation device is configured such that vibration of a desired frequency is generated by controlling an electric current supplied to the coil 81.

CITATION LIST

Patent Literature

Patent Literature 1: Japanese Patent Application Publication No. 2006-79136 (FIG. 7, [0016]-[0018])

SUMMARY

Technical Problem

One representative device to which a force feedback-type touch panel device has been applied and which has been already put to practical use is a vehicle navigation device. Such a vehicle navigation device is predominantly used inside a vehicle, and various vibrations, such as vibration generated by the engine mounted in the vehicle and vibration generated between the tires and the road surface, are transmitted inside the vehicle when it is moving. Therefore, when such a vehicle navigation device is operated inside the moving vehicle, the vibrations generated by the vehicle and the vibration generated by the force feedback-type touch panel device become mixed together. Thus, in some cases, feedback to an operator becomes unclear. As described above, as the vibrations generated inside the moving vehicle include those of various frequencies, it is considered difficult to make the feedback clear by selecting a specific frequency.

In order to make vibration-based feedback clear even under the type of environment described in the aforementioned example, in which various vibrations from an external environment affect the feedback, it is effective to present a stronger tactile sensation to the operator by making the vibration amplitude for the feedback larger than that in conventional art.

In the known tactile sensation presentation device disclosed in Patent Literature 1, it is disclosed that suspensions 92, which are formed of elastic bodies, are arranged in the vicinity of four corners of the panel and vibrations of undesired frequencies are suppressed by the suspensions 92. However, whatever the frequencies are, suppressing vibrations is tantamount to restricting displacement of the panel, and having such a vibration suppression mechanism becomes an inhibiting factor in terms of obtaining a large vibration amplitude.

In addition, displacement characteristics of an elastic body generally require a larger external force in proportion to the size of a displacement amount. Based on displacement characteristics, it is considered that the above-described suspensions operate to restrict the displacement of the panel more strongly as the displacement of the panel resulting from the vibration for the feedback becomes larger, namely, as the amplitude of the vibration becomes larger. This also becomes an inhibiting factor in terms of obtaining a large vibration amplitude.

Further, in the known tactile sensation presentation device disclosed in Patent Literature 1, the vibration is generated by displacing the touch panel itself. Besides this device, a force feedback-type touch panel device is also known that has a mode in which vibration is generated by bending a touch panel itself using a piezoelectric element. In either case, it inevitably becomes necessary to expose a surface of the touch panel to the exterior of the device in order to transmit the vibration to the operator. As many touch panels use a glass plate as their base material, it is also a matter of urgency to come up with a countermeasure against breakage or damage of the glass plate when an impact is applied to the surface of the touch panel exposed to the exterior of the device.

The present invention has been made to solve the above-described problems, and an object of the present invention is to provide a force feedback-type touch panel device that is capable of providing clearer feedback to an operator by presenting the operator with a vibration having a larger amplitude than that in conventional art and that is also capable of preventing a touch panel from being broken or damaged when an external impact is applied to the touch panel.

Solution to Problem

To solve the above-described problems, a force feedback-type touch panel device according to a first aspect of the present invention includes: a base member; a touch panel that is retained by the base member; a cover member that is formed of a hard synthetic resin in a shape such that it covers the touch panel and that is retained so as to be able to be displaced in a perpendicular direction with respect to a flat surface of the touch panel; and an actuator that causes the cover member to be displaced in an opposite direction from the base member along the perpendicular direction with respect to the flat surface of the touch panel. With this configuration, the touch panel can detect an operating body when the operating body makes contact with or comes close to a surface of the cover member. The touch panel further includes a first magnet that is fixed on one of the base member and the cover member and any one of a second magnet and a magnetic body that is fixed on the other of the base member and the cover member such that the second magnet or the magnetic body faces and is attracted to the first magnet. The cover member is urged in a direction toward the base member by the attraction force generated between the first magnet and the second magnet or the magnetic body.

The invention according to the first aspect of the present invention is mainly characterized in that a known vibration suppression mechanism that uses an elastic body is eliminated, and in its place, the cover member is urged by the magnetic force of a magnet or a magnetic body. It is generally known that a magnetic force diminishes inversely with the square of a distance from a magnetic source, such as a magnet. Based on this, in the above-described configuration, as the cover member is displaced in the direction of moving further away from the base member, a distance between the magnets (or between the magnet and the magnetic body) becomes larger and the attraction force generated therebetween diminishes accordingly. Therefore, in comparison with the conventional vibration suppression mechanism, restrictions on vibration amplitude are eased and it is possible to obtain maximum displacement of the cover member, which presents the vibration to an operator as feedback, and to thus provide clearer feedback to the operator.

Further, since an operation surface of the touch panel is covered by the cover member formed of the hard synthetic resin and the touch panel device uses the touch panel that can detect the operating body when it makes contact with or comes close to the surface of the cover member, it is not necessary to directly expose the operation surface of the touch panel on a surface of the device. Therefore, any breakage or damage to the touch panel is effectively prevented, as the cover member can receive an impact that is received by the touch panel in conventional art. From this point of view, it should be noted that it is preferable to form the cover member with a synthetic resin that has high anti-shock properties.

The force feedback-type touch panel device according to a second aspect of the present invention is characterized in that the base member has a first positioning portion, the cover member has a second positioning portion that engages with the first positioning portion, and the engagement between the first positioning portion and the second positioning portion regulates displacement of the cover member with respect to the base member along the flat surface of the touch panel.

According to the invention according to the second aspect of the present invention, it is possible to prevent the cover member from wobbling by regulating unnecessary displacement of the cover member in the direction along the flat surface of the touch panel.

The force feedback-type touch panel device according to a third aspect of the present invention is characterized in that the touch panel is an electrostatic capacitance-type touch panel.

According to the invention according to the third aspect of the present invention, by using the electrostatic capacitance-type touch panel as the touch panel and by then setting the sensitivity thereof in an appropriate manner, a configuration can be realized in which it is possible to detect the operating body when it makes contact with or comes close to a surface of the base member, even if the surface of the base member, which substantially functions as an input operation surface, and a surface of the touch panel, which is an originally intended input operation surface, are separated from each other.

The force feedback-type touch panel device according to a fourth aspect of the present invention further includes a display device that is arranged on a back surface side of the touch panel, and both the touch panel and the cover member have a light-transmitting property so that a display of the display device is visually recognizable through the touch panel and the cover member.

According to the invention according to claim 4 of the present invention, it is possible to realize a force feedback-type touch panel device on which the operator can perform an input operation with respect to an operation button displayed on the display device, through the cover member and the touch panel.

Advantageous Effects of Invention

According to the present invention, it is possible to provide clearer feedback to an operator by presenting to the operator a vibration having a larger amplitude than that of a conventional force feedback-type touch panel device, in which a touch panel itself is vibrated, and also to prevent a touch panel from being broken or damaged when an external impact is applied to the touch panel.

DESCRIPTION OF EMBODIMENTS

A force feedback-type touch panel device 1 according to an embodiment of the present invention will be described below with reference to FIG. 1 to FIG. 6B.

Figure 1:
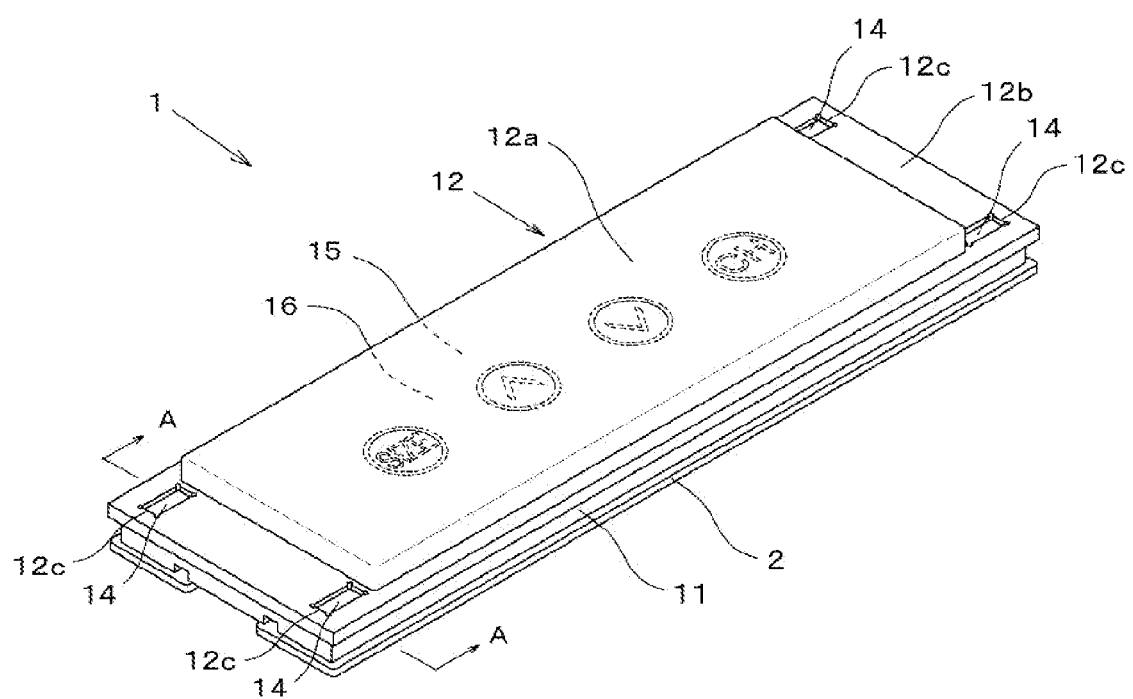
FIG. 1 is an external view of a force feedback-type touch panel device according to an embodiment of the present invention.

FIG. 1 shows an external view of the touch panel device 1 according to the present embodiment. The touch panel device 1 according to the present embodiment has a structure in which a printed wiring substrate 2, a base member 11 and a cover member 12 are stacked together in this order. The cover member 12 has a flat plate portion 12a that is formed as a raised flat surface and an extended portion 12b that surrounds the flat plate portion 12a. Below the flat plate portion 12a, an electrostatic capacitance-type touch panel 15 that serves as a touch panel and a liquid crystal display device 16 that serves as a display device are retained by the base member 11 (to be described below in detail). Both the cover member 12 and the electrostatic capacitance-type touch panel 15 are transparent. Thus, letters and symbols such as "SIZE" and "CH" that are displayed on the liquid crystal display device 16 can be visually recognized through the cover member 12 and the electrostatic capacitance-type touch panel 15.

When mounting the touch panel device 1 according to the present embodiment in a device (not shown in the drawings), while the above-described flat plate portion 12a is arranged to be exposed on a surface of the device, the remaining portion except for the flat plate portion 12a is mounted in the device such that the remaining portion is hidden inside a case of the device. At that time, it is preferable to mount the touch panel device 1 according to the present embodiment in the device while maintaining a slight gap between the case of the device and a top surface of the extended portion 12b, so as to enable the cover member 12 to be displaced in the perpendicular direction with respect to the flat surface of the touch panel. If necessary, the gap may be filled with an elastic body, such as a sponge, which does not easily damp the vibration of the cover member 12.

Figure 2:
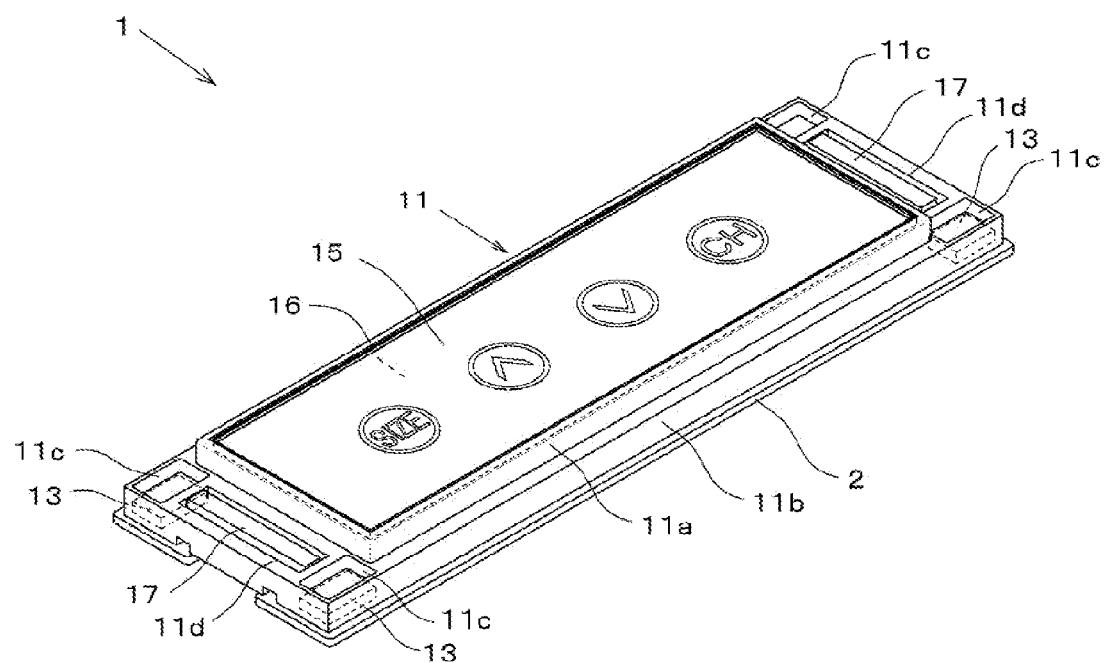
FIG. 2 is an external view illustrating a state in which a cover member is removed from the force feedback-type touch panel device shown in FIG. 1.

FIG. 2 shows an external view of a state in which the cover member 12 is removed from the touch panel device 1 according to the present embodiment. In this state, the base member 11 and the electrostatic capacitance-type touch panel 15 are exposed. The base member 11 is formed of an acrylonitrile butadiene styrene (ABS) resin in a frame shape. The base member 11 has a protruding portion 11a that is formed in a shape corresponding to the flat plate portion 12a of the above-described cover member 12 and a base portion 11b that surrounds the protruding portion 11a. Internal dimensions of the protruding portion 11a are slightly larger than external dimensions in a plan view of the liquid crystal display device 16 and the electrostatic capacitance-type touch panel 15, and the liquid crystal display device 16 and the electrostatic capacitance-type touch panel 15 are retained inside the protruding portion 11a in a stacked state.

First positioning portions 11c, which are formed in a rectangular concave shape, are provided at four corners of the base portion 11b, respectively, and neodymium magnets as first magnets 13 are fixed to a back surface side, each corresponding to a bottom surface of each of the first positioning portions 11c. The first magnet 13 has a flat shape in a plan view that is substantially similar to the shape of the first positioning portion 11c. Further, the first magnet 13 is magnetized so as to have opposite polarities in the thickness direction. It should be noted that neodymium magnets are suitable for the present embodiment as they have a strong magnetic force and can generate a strong attraction force even when they have small external dimensions.

Two actuator containing portions 11d that contain actuators 17 are provided at both ends of the base member 11b with the protruding portion 11a interposed between the ends thereof, the actuators 17 being mounted on the printed wiring substrate 2. The actuator containing portions 11d are holes in a plan view that are slightly larger than the actuators 17 and penetrate through the base portion 11b in the thickness direction.

The liquid crystal display device 16 can render a desired display image based on a predetermined signal supplied by display control means (not shown in the drawings) that is mounted on the printed wiring substrate 2. As an example, FIGS. 1 and 2 show a state in which circular buttons containing a letter or a symbol, namely "SIZE", "Λ", "v" and "CH" in this order from the left side, are displayed side by side in a straight line. It should be noted that an electroluminescent (EL) display device or the like can be also favorably used as a display device instead of the liquid crystal display device 16, for example.

The electrostatic capacitance-type touch panel 15 is a known mutual capacitance-type touch panel and has a structure in which a plurality of signal output lines and signal detection lines are arranged on a glass substrate, the signal output lines and the signal detection lines being mutually orthogonal. The electrostatic capacitance-type touch panel 15 is connected to the printed wiring substrate 2 by not-shown connection means and is controlled by touch panel control means (not shown in the drawings) that is mounted on the printed wiring substrate 2. Based on the control, when an operating body such as a finger comes close to the electrostatic capacitance-type touch panel 15, a position on a surface of the electrostatic capacitance-type touch panel 15, to which the operating body comes close, can be identified on the basis of changes in electrostatic capacitance taking place in the respective signal lines.

The sensitivity of the electrostatic capacitance-type touch panel 15 is set so as to be able to detect the operating body such as a finger even when the operating body is not directly in contact with the surface of the electrostatic capacitance-type touch panel 15, namely, even when the operating body is separated from the surface of the electrostatic capacitance-type touch panel 15.

More specifically, inside the above-described touch panel control means, a threshold value regarding a change amount of electrostatic capacitance is stored in advance to determine whether the operating body makes contact with or comes close to the flat plate portion 12a. The threshold value is set in advance on the basis of a distance from the surface of the electrostatic capacitance-type touch panel 15 to a surface of the flat plate portion 12a, and the electric permittivity of a synthetic resin of which the flat plate portion 12a is formed, etc. The threshold value is set such that when the distance from the surface of the flat plate portion 12a to the operating body becomes smaller than a certain value, the change amount of the electrostatic capacitance exceeds the threshold value. In this manner, even when the surface of the flat plate portion 12a, which substantially functions as an input operation surface, is separated from the surface of the touch panel, which is an originally intended input operation surface, it is possible for the electrostatic capacitance-type touch panel 15 to detect the operating body when it makes contact with or comes close to the surface of the flat plate portion 12a.

Figure 3A:
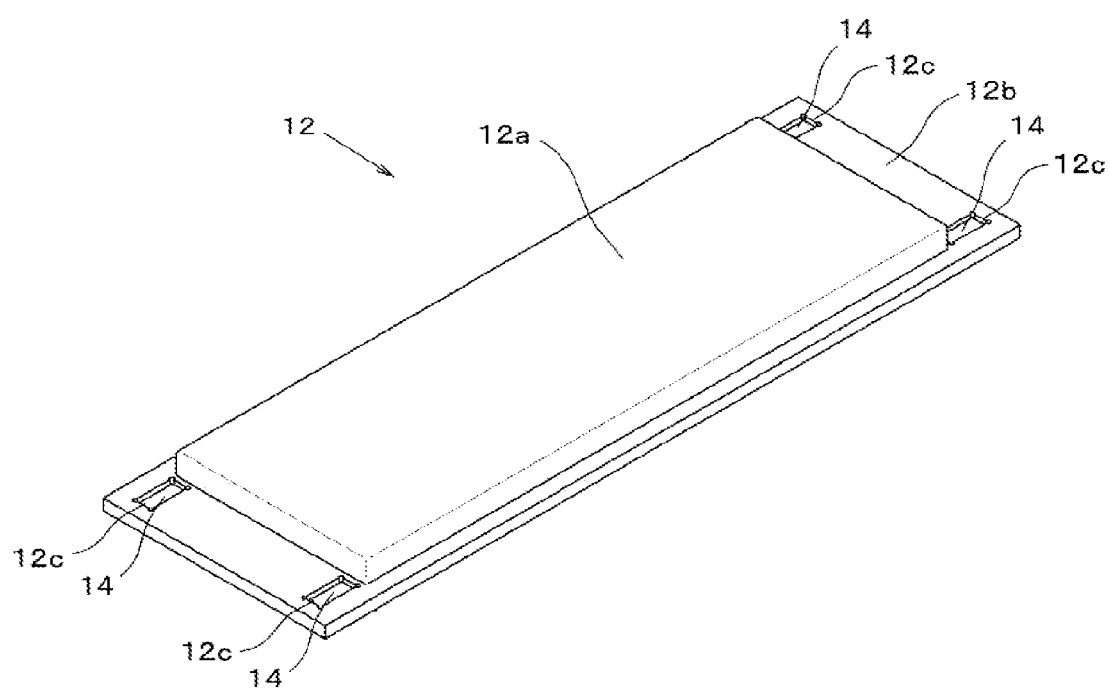
FIGS. 3A and 3B are each an external view of the cover member, etc. of the force feedback-type touch panel device shown in FIG. 1, FIG. 3A illustrating a front side and FIG. 3B illustrating a back side thereof.
Figure 3B:
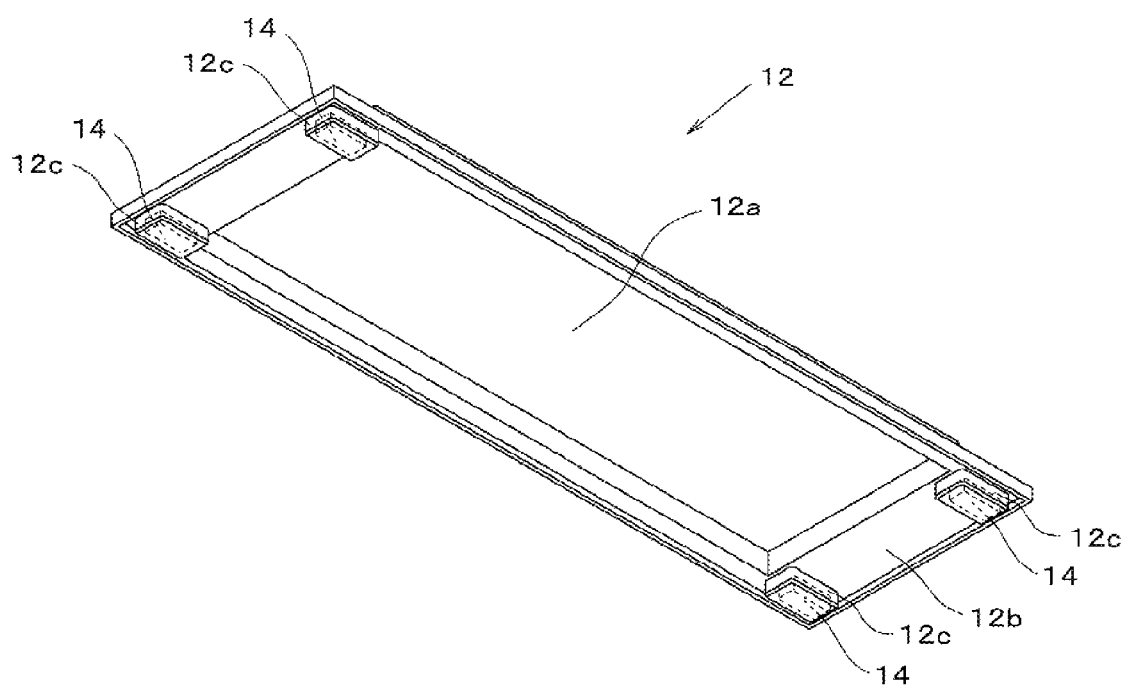

FIGS. 3A and 3B are each an external view of the cover member 12 including second magnets 14, FIG. 3A illustrating a front side and FIG. 3B illustrating a back side of the cover member 12. The cover member 12 is formed of an ABS resin, which is transparent and has sufficient anti-impact strength, and it is not easily broken or damaged even when an external impact is applied to the flat plate portion 12a. It should be noted that a polycarbonate resin or an acrylic resin may be used as a synthetic resin material that forms the cover member 12 instead of the ABS resin.

Second positioning portions 12c that are formed in a rectangular convex shape toward the back side are provided at four corners of the extended portion 12b, respectively. Although the shape of the second positioning portions 12c in a plan view is substantially similar to a shape of the first positioning portions 11c in a plan view, dimensions of the second positioning portions 12c are slightly smaller than those of the first positioning portions 11c such that when the cover member 12 is mounted on the base member 11, the first positioning portions 11c and the second positioning portions 12c mutually engage with each other. In this manner, the cover member 12 is retained with respect to the base member 11 in a state in which displacement of the cover member 12 is regulated in the direction along the flat surface of the touch panel as well as in a state in which the displacement of the cover member 12 is enabled in the direction along the perpendicular direction with respect to the flat surface of the touch panel.

The second positioning portions 12c are formed in a rectangular concave shape when viewed from the front side, and inside the second positioning portions second 12c, neodymium magnets are fixed as the second magnets 14. Explaining a method of fixing the second magnets 14 in detail, dimensions in a plan view of the concave shape corresponding to the second positioning portions 12c are formed slightly smaller than dimensions in a plan view of the second magnets 14 and the second magnets 14 are fixed by being press-fitted into respective concave-shaped sections.

The second magnet 14 has a flat shape in a plan view that is substantially similar to the concave shape corresponding to the second positioning portion 12c. In a similar manner to the first magnets 13, the second magnets 14 are magnetized so as to have opposite polarities in the thickness direction and they are fixed to the cover member 12 so as to have the magnetic polar direction that causes the first magnets 13 and the second magnets 14 to be attracted to each other. When the cover member 12 is mounted on the base member 11, the first magnets 13, which are fixed below the first positioning portions 11c, and the second magnets 14, which are fixed inside the second positioning portions 12c, face each other and a sufficient attraction force is generated between the first magnets 13 and the second magnets 14 by magnetic force. It should be noted that, although the neodymium magnets having smaller external dimensions than those of the first magnets 13 are used as the second magnets 14 in the present embodiment, the external dimensions of the magnets may be freely chosen as long as the magnets generate the sufficient attraction force between the first magnets 13 and the second magnets 14.

Figure 4:
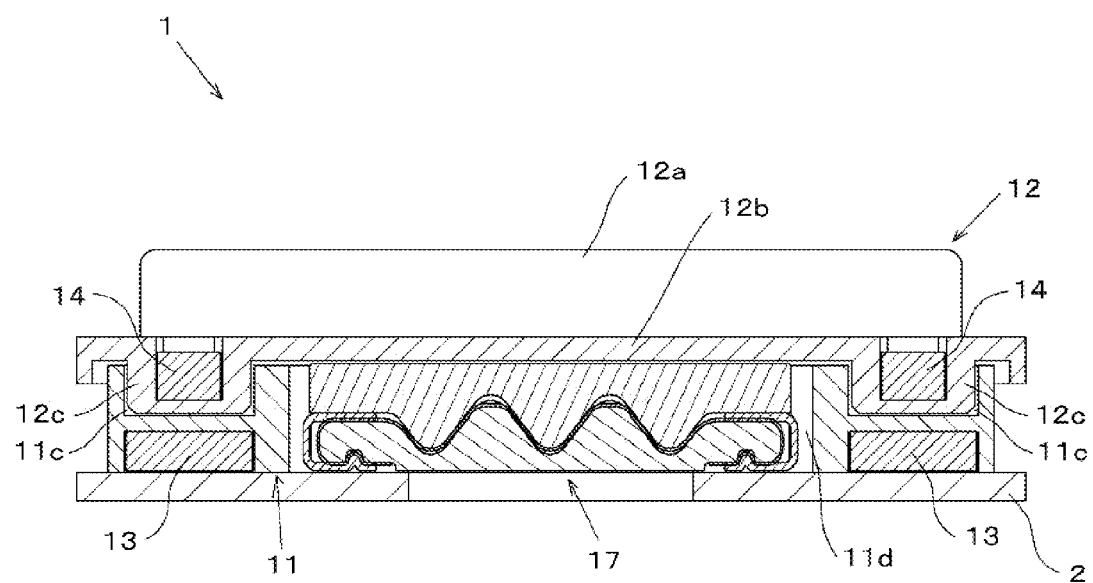
FIG. 4 is a cross-sectional view taken along line A-A shown in FIG. 1.

FIG. 4 is a cross-sectional view taken along line A-A shown in FIG. 1 and shows a cross section around the actuator containing portions 11d. A top surface of the actuator 17, which is contained in the actuator containing portion 11d, substantially matches a top surface of the base portion 11b, and when the cover member 12 is mounted on the base member 11, the top surface of the actuator 17 abuts against an opposing surface of the extended portion 12b of the cover member 12. Therefore, as described below, when the actuators 17 are displaced along the perpendicular direction with respect to the flat surface of the touch panel, the displacement is transmitted to the cover member 12.

As described above, the first positioning portions 11c and the second positioning portions 12c engage with each other and retain the cover member 12 with respect to the base member 11. The depths of the first positioning portions 11c and the protrusion heights of the second positioning portions 12c are sufficiently large with respect to an amount of displacement that may be caused by the actuators 17, so that even when displacement of the cover member 12 caused by the actuators 17 reaches a maximum amount, the mutual engagement between the first positioning portions 11c and the second positioning portions 12c is not released. Further, by having the mutual engagement, unnecessary displacement in the direction along the flat surface of the touch panel of the cover member 12 is regulated and unnecessary wobbling of the cover member 12 is prevented.

Figure 5:
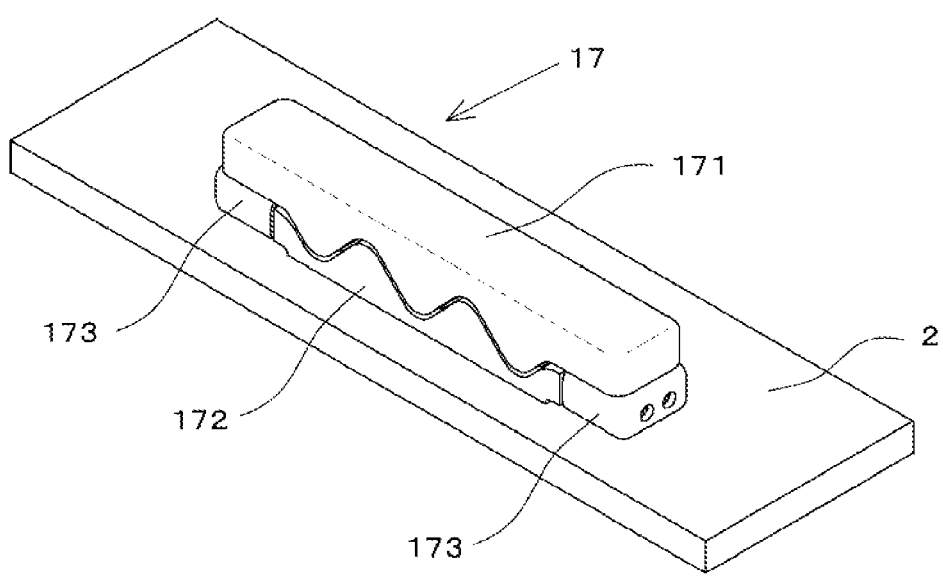
FIG. 5 is an external view of an actuator of the force feedback-type touch panel device shown in FIG. 1.

FIG. 5 shows an external view of the actuator 17 used in the present embodiment. FIG. 5 shows an initial state before the actuator 17 is displaced. It should be noted that an external shape of the printed wiring substrate 2 shown in FIG. 5 is simplified and it need not necessarily match the external shape of the printed wiring substrate 2 shown in FIG. 1, etc.

The actuator 17 includes a movable member 171, a fixed member 172, two terminal fittings 173 and a shape-memory alloy wire 174. The movable member 171 and the fixed member 172 are both formed of a hard insulating material. A back surface of the movable member 171 and a top surface of the fixed member 172 are formed to have mutually corresponding surfaces having a wave shape that includes concave and convex sections formed alternately, and the shape-memory alloy wire 174 is arranged between the mutually corresponding concave and convex surfaces. It should be noted that the movable member 171 and the fixed member 172 may be formed of a conductive metal material, etc., but in that case, it is necessary to take measures to prevent a short circuit that may occur between two of the terminal fittings 173 by applying an insulating film to respective surfaces of the movable member 171 and the fixed member 172, for example.

The shape-memory alloy wire 174 is fixed by the terminal fittings 173 at both ends of the fixed member 172. The shape-memory alloy wire 174 used in the present embodiment is a nickel-titanium alloy that is conductive, has a relatively low resistance value and an extremely thin wire diameter, and has a soft flexible string-like form at a room temperature environment. When an electric current is supplied to the shape-memory alloy wire 174, the shape-memory alloy wire 174 itself produces heat and hardens and shrinks in response to the heat. It should be noted that the shape-memory alloy wire 174 is not limited to the nickel-titanium alloy and may be formed of another metal or alloy as long as it demonstrates similar characteristics to those of the nickel-titanium alloy.

The terminal fittings 173 are fitted at both the ends of the fixed member 172 along with end portions of the shape-memory alloy wire 174, so that the end portions of the shape-memory alloy wire 174 are fixed by the terminal fittings 173 with sufficient strength to stop the shape-memory alloy wire 174 from coming loose. The terminal fittings 173 are formed of a conductive metal and soldered to a land of a predetermined shape (not shown in the drawings) provided on the printed wiring substrate 2. As a result, the fixed member 172 is fixed on the printed wiring substrate 2.

Figure 6A:
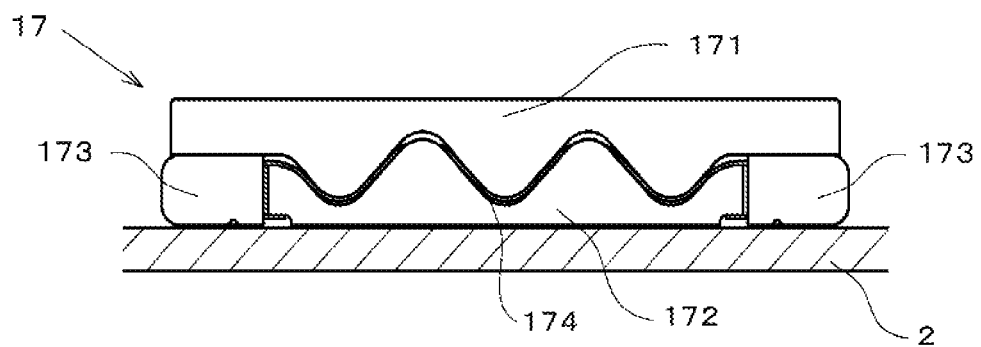
FIGS. 6A and 6B are each a diagram for explaining operations of the actuator shown in FIG. 5, FIG. 6A illustrating a state before displacement and FIG. 6B illustrating a state after the displacement.

Operations of the actuator 17 will be described with reference to FIGS. 6A and 6B. FIG. 6A shows a state in which the shape-memory alloy wire 174 is not energized, namely, a state before the shape-memory alloy 174 is displaced. In this state, the shape-memory alloy wire 174 is in a state of being soft and flexible, and the movable member 171 and the fixed member 172 are in a state of being adjacent to each other, while clamping the shape-memory alloy wire 174 therebetween, due to the above-described attraction force generated between the first magnets 13 and the second magnets 14.

Figure 6B:
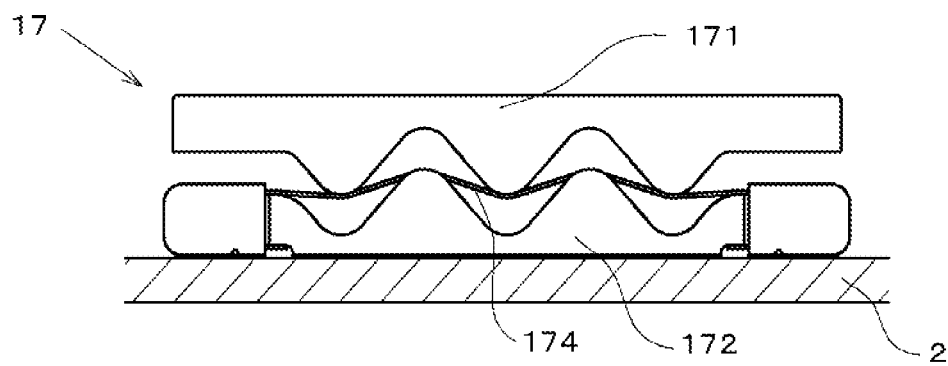
Figure 7:
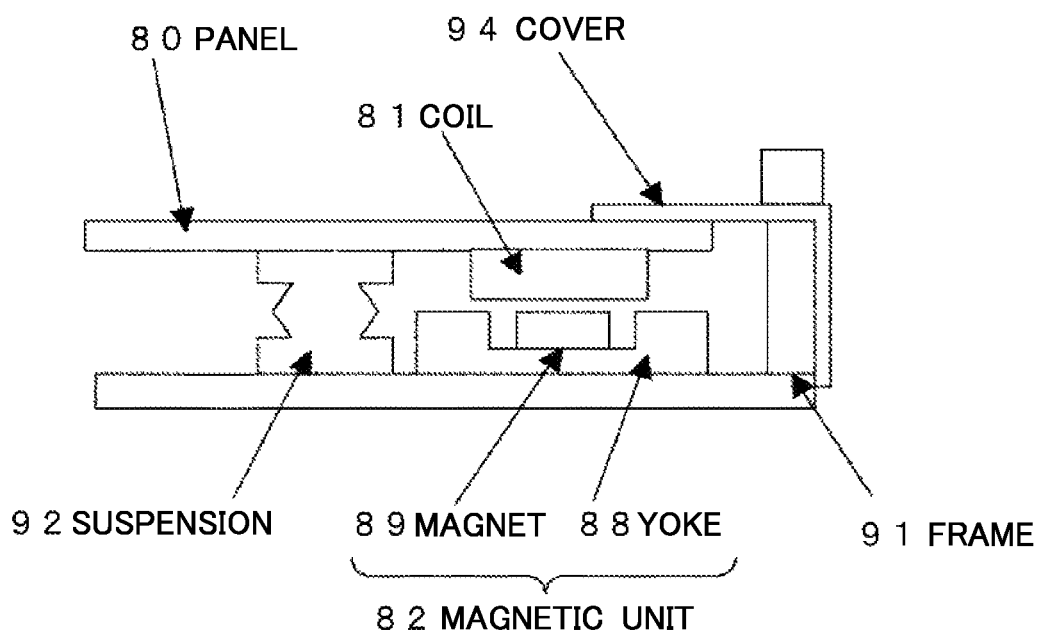
FIG. 7 is a diagram showing a related technology.

FIG. 6B shows a state in which the shape-memory alloy wire 174 is energized, namely, a state after the actuators 17 are displaced. In this state, the shape-memory alloy wire 174 shrinks, and accordingly, the movable member 171 is displaced in the opposite direction from the fixed member 172 along the perpendicular direction with respect to the flat surface of the touch panel, while resisting the attraction force generated between the first magnets 13 and the second magnets 14. Following the displacement of the movable member 171, the cover member 12 that is mounted on the movable member 171 is also displaced in the same direction, namely, in the opposite direction from the base member 11.

At that time, as a result of the displacement, a distance between the first magnets 13 and the second magnets 14 becomes larger and the magnetic force therebetween diminishes inversely with the square of the distance. More specifically, since the attraction force generated between the first magnets 13 and the second magnets 14 becomes weaker as the cover member 12 moves further away from the base member 11, and accordingly, restrictions on the displacement of the cover member 12 are eased, it becomes possible to obtain the maximum displacement of the cover member 12.

From the state shown in FIG. 6B, when the energization of the shape-memory alloy wire 174 is stopped, the shape-memory alloy wire 174 is cooled by the temperature difference with the atmosphere and by heat dissipation to the movable member 171, the fixed member 172 and the terminal fittings 173 respectively, so that the length of the shape-memory alloy wire 174 returns to its original length in a non-energized state. Further, the shape-memory alloy wire 174 immediately returns to the state shown in FIG. 6A by the action of the attraction force generated between the first magnets 13 and the second magnets 14, and accordingly, the cover member 12 also returns to the original state before the displacement thereof takes place.

In this manner, by periodically supplying and stopping the electric current supplied to the shape-memory alloy wire 174, the displacement of the movable member 171 is repeated. By the periodic displacement of the actuators 17, it is possible to cause the cover member 12 to vibrate.

Operations of the present embodiment having the above-described configuration will be described.

For example, when an operator causes his/her finger to come close to a section of a "CH" button displayed on the liquid crystal display device 16 of the touch panel device 1 according to the present embodiment, a change amount of the electrostatic capacitance that is detected by the electrostatic capacitance-type touch panel 15 becomes larger as a distance from the surface of the electrostatic capacitance-type touch panel 15 to the finger becomes smaller. When the finger makes contact with (or comes sufficiently close to) the surface of the flat plate portion 12a, the change amount of electrostatic capacitance exceeds the threshold value, and consequently, it is detected that some kind of operation has been performed. After that, scanning of the electrostatic capacitance-type touch panel 15 is performed to identify the position of the operation. It is then identified that the operation with respect to the "CH" button has been performed and the operation by the operator is accepted. At that time, as feedback indicating that the operation of the operator has been accepted, by energizing and stopping energizing the actuators 17 at a predetermined frequency, a predetermined vibration is provided to the cover member 12 and presented to the operator. The operator causing his/her finger to be in contact with the flat plate portion 12a senses the vibration via the tip of his/her finger and can acknowledge that his/her operation has been accepted. At that time, it is even more preferable to also appeal to the visual sense of the operator by changing a color tone of the "CH" button displayed on the liquid crystal display device 16.

Although neodymium magnets are used for both the first magnets and the second magnets in the present embodiment, types of the magnet are not limited thereto. As modified examples, either of the first magnets or the second magnets may be replaced by magnetic bodies such as iron for example, or either of the first magnets or the second magnets or both of them may be replaced by electromagnets.

Further, although the actuator using the shape-memory alloy wire is illustrated as an example in the present embodiment, various types of actuators can be applied, such as an actuator combining a coil and a magnetic unit, as in an example of conventional art, and an actuator to which an electromagnetic solenoid is applied, as long as the actuator can cause the cover member to be displaced while resisting the attraction force generated between the first magnets and the second magnets.

INDUSTRIAL APPLICABILITY

For example, the present invention can be preferably applied as touch panel operation input means for an electronic device such as a vehicle navigation device and a mobile phone.

REFERENCE SIGNS LIST

1 Force feedback-type touch panel device
11 Base member
11a Protruding portion
11b Base portion
11c First positioning portion
11d Actuator containing portion
12 Cover member
12a Flat plate portion
12b Extended portion
12c Second positioning portion
13 First magnet
14 Second magnet
15 Electrostatic capacitance-type touch panel (touch panel)
16 Liquid crystal display device (display device)
17 Actuator
171 Movable member
172 Fixed member
173 Terminal fitting
174 Shape-memory alloy wire
2 Printed wiring substrate

The invention claimed is:

1. A force feedback-type touch panel device comprising:
a base member;
a touch panel that is retained by the base member;
a cover member that is formed of a hard synthetic resin in a shape such that it covers the touch panel and that is retained so as to be able to be displaced in a perpendicular direction with respect to a flat surface of the touch panel;
an actuator that causes the cover member to be displaced in an opposite direction from the base member along the perpendicular direction with respect to the flat surface of the touch panel, the touch panel being able to detect an operating body when the operating body makes contact with or comes close to a surface of the cover member;
a first magnet that is fixed on one of the base member and the cover member; and
any one of a second magnet and a magnetic body that is fixed on the other of the base member and the cover member such that the second magnet or the magnetic body faces and is attracted to the first magnet, the cover member being urged in a direction toward the base member by an attraction force generated between the first magnet and the second magnet or the magnetic body, wherein the first magnet and the second magnet or the magnetic body are arranged with respect to the actuator such that the cover member is displaced by the actuator against the attraction force generated by the first magnet and the second magnet or the magnetic body.

2. The force feedback-type touch panel device according to claim 1, wherein:

the base member has a first positioning portion;

the cover member has a second positioning portion that engages with the first positioning portion; and engagement between the first positioning portion and the second positioning portion regulates displacement of the cover member with respect to the base member along the flat surface of the touch panel.

3. The force feedback-type touch panel device according to claim 1, wherein the touch panel is an electrostatic capacitance-type touch panel.

4. The force feedback-type touch panel device according to claim 1, further comprising a display device that is arranged on a back surface side of the touch panel, and wherein both the touch panel and the cover member have a light-transmitting property so that a display of the display device is visually recognizable through the touch panel and the cover member.

* * * * *